US006452305B1

(12) United States Patent
Mellen et al.

(10) Patent No.: US 6,452,305 B1
(45) Date of Patent: Sep. 17, 2002

(54) HIGH POWER SURFACE ACOUSTIC WAVE DEVICE

(75) Inventors: Neal J. Mellen, Tempe, AZ (US); Shouliang Lai, Albuquerque, NM (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/524,894

(22) Filed: Mar. 14, 2000

(51) Int. Cl.[7] .................................. H01L 41/04
(52) U.S. Cl. ...................................... 310/313 R
(58) Field of Search ...................... 310/313 R

(56) References Cited

U.S. PATENT DOCUMENTS

| | | | | |
|---|---|---|---|---|
| 4,449,107 A | * | 5/1984 | Asai et al. | 333/150 |
| 4,775,814 A | * | 10/1988 | Yuhara et al. | 310/313 R |
| 5,171,642 A | * | 12/1992 | DeHaven | 428/620 |
| 6,259,185 B1 | * | 7/2001 | Lai | 310/313 B |
| 6,271,617 B1 | * | 8/2001 | Yoneda et al. | 310/313 D |

FOREIGN PATENT DOCUMENTS

| | | |
|---|---|---|
| EP | 0803919 A | 10/1997 |
| WO | WO00/33394 | 6/2000 |

OTHER PUBLICATIONS

"TI–Added Electrodes on LIT A03 36 Deg Y–X Substrates for High Power Surface Acoustic Wave Devices I", Ota et al., Jap. Jnl. Of App. Physics, vol. 32, May 1, 1993, pp. 2351–2354.

* cited by examiner

*Primary Examiner*—Brian Sircus
*Assistant Examiner*—Michael C. Zarroli
(74) *Attorney, Agent, or Firm*—William E. Koch; Douglas W. Gilmore

(57) ABSTRACT

A high power SAW device includes an electrode positioned on a piezoelectric substrate. The electrode includes a bonding layer of material deposited on and bonding with the substrate and a conductive structure, of at least one layer of material, overlying the bonding layer and fixedly bonded to the substrate by the bonding layer. The conductive structure includes aluminum and an alloy metal with the alloy metal being in a range from approximately 1% by weight to a percent providing for a fravorable trade-off of resistivity versus mechanical properties. The alloy metal is selected from elements in one of the IV and VI columns of the periodic table, e.g. titanium, molybdenum, chromium, and tungsten.

10 Claims, 1 Drawing Sheet

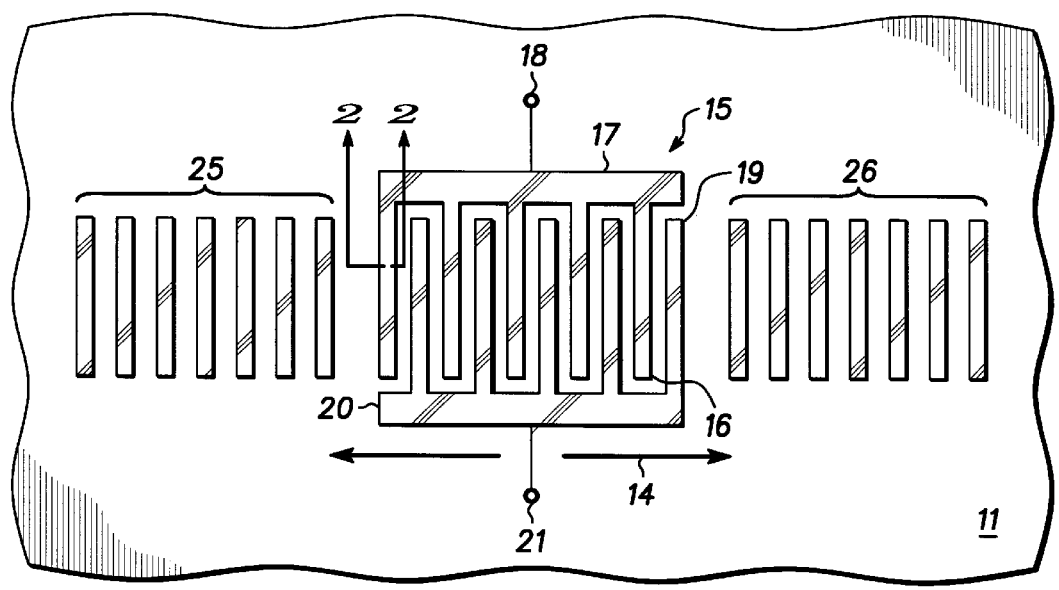
10 FIG. 1
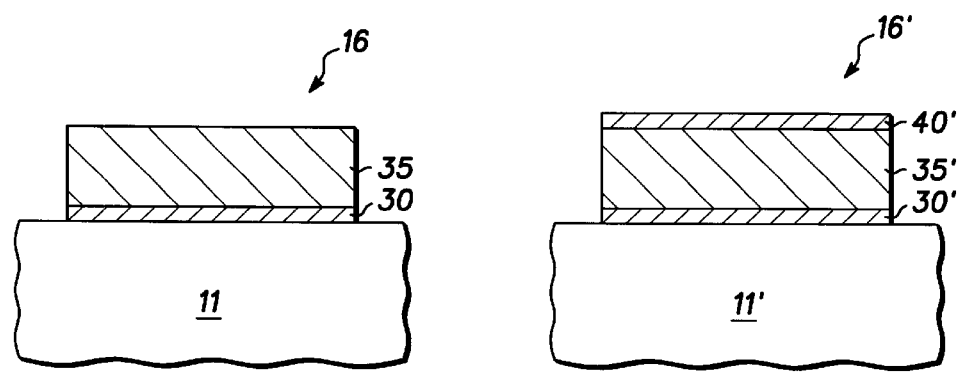
10 FIG. 2     10' FIG. 3

HIGH POWER SURFACE ACOUSTIC WAVE DEVICE

FIELD OF THE INVENTION

This invention relates to high power surface acoustic wave devices and methods of fabrication.

BACKGROUND OF THE INVENTION

In the present communication age, more and more emphasis is being placed on wireless communications and particularly on small handheld communication devices, such as two-way radios, cellular telephones, etc. Because of the ever increasing need, or desire, to make these handheld devices smaller, it is imperative that various components within the devices be made smaller. Traditionally, in the past, components such as filters have been difficult to miniaturize and many attempts have resulted in inferior components which either do not have a sufficiently long life or cannot withstand the power requirements.

Surface acoustic wave (SAW) devices have been known for a long time and relatively recently have been incorporated as filters into the front end of handheld communication devices. It is well known in the art that SAW devices can be fabricated very frequency sensitive so that they make excellent filters. However, the size of the SAW device is dependent upon the operating frequency, i.e. the higher the frequency the smaller the SAW device. The major problem that arises is that the SAW filters must be made very small because of the very high radio frequencies that are being used in the various communication systems. In addition to the size requirement, the present handheld devices transmit relatively high power (e.g. a watt or more). Thus, the SAW filters are becoming smaller while the power handling requirement remains high. Thus, the SAW fabrication materials and techniques must be continually improved.

Accordingly it is highly desirable to provide SAW devices with improved materials and fabrication methods which result in small SAW devices with relatively large power handling capabilities and longer life.

BRIEF DESCRIPTION OF THE DRAWINGS

FIG. 1 is a view in top plan of a high power surface acoustic wave device in accordance with the present invention;

FIG. 2 is a sectional view as seen from the line 2—2 in FIG. 1; and

FIG. 3 is a sectional view similar to FIG. 2 of another embodiment.

DESCRIPTION OF THE PREFERRED EMBODIMENT

Referring to FIG. 1, a top plan of a high power surface acoustic wave (SAW) device 10 is illustrated. SAW device 10 includes a piezoelectric substrate 11 which may include any of the well known materials commonly used in the industry, such as quartz, lithium niobate, lithium tantalate, lithium tetraborate, and the like. In this specific embodiment, SAW device 10 is depicted as a SAW filter or resonator including a transducer, generally designated 15. Transducer 15 includes a first set of parallel spaced apart electrodes 16 connected by a common bus 17 having an external terminal 18 and a second set of parallel spaced apart electrodes 19 connected by a common bus 20 having an external terminal 21. Electrodes 16 and 19 are positioned in the common interdigitated relationship to provide the well known surface acoustic wave operation. A first reflector 25, formed by a plurality of parallel spaced apart elements is positioned to the left of transducer 15 in FIG. 1 and a second similar reflector 26 is positioned to the right of transducer 15 in FIG. 1. As is well understood, the size and spacing of electrodes 16 and 19 and the positions of reflectors 25 and 26 are dependent upon the operating frequency.

During operation, the RF signal is coupled to the substrate 11 through electrodes 16 and 19 causing the generation of surface acoustic waves which actually move or oscillate electrodes 16 and 19 at the operating frequency. The major problem causing failure in SAW devices is that one or more of the electrodes or portions of one or more of the electrodes literally blows-up or fragments during operation. Because of the relatively high power (1 Watt or more) and the very high radio frequency (RF) signals at which the present SAW devices must operate, and the motion from the surface acoustic waves tremendous stresses are produced in electrodes 16 and 19. The catastrophic mechanical failures are believed to be caused by a combination of high temperatures generated by the relatively high power RF signals, the stresses produced by the movement at the very high RF signal rates, and various characteristics of the material forming electrodes 16 and 19, including hardness or toughness, resistivity, grain size, and bonding characteristics.

Referring additionally to FIG. 2, which illustrates a cross-section of one of SAW electrodes 16 and 19 (herein designated 16 for convenience), electrode 16 is fabricated by depositing a layer 30 of bonding material on the surface of substrate 11. Because many materials suitable for use as electrodes 16 and 19 will not bond properly with substrate 11, it is desirable to first deposit a layer of material that bonds well with the substrate material. Such materials are generally elements in the IV or VI columns of the periodic table, for example, titanium, titanium-tungsten, titanium-tungsten-nitride, chromium, molybdenum, and combinations thereof. It is imperative that layer 30 bonds rigidly to the surface of substrate 11 to withstand the surface acoustic waves coupled from the substrate. Any release or pealing of layer 30 from substrate 11 results in failure of device 10.

A conductive structure 35, including at least one layer of conductive material, is deposited in overlying relationship on bonding layer 30. Conductive structure 35 is formed of material that fixedly bonds to bonding layer 30 and is, therefore, fixedly bonded to the surface of substrate 11. Conductive structure 35 includes aluminum and an alloy metal, each of which may be deposited in individual layers or simultaneously in a single layer. Here it should be understood that during deposition of individual layers the heat of the deposition process is sometimes sufficient to cause the individual layers of material to substantially alloy into a single compound metal. Also, if the metals are deposited simultaneously in a single layer, the alloying occurs during deposition so that a single compound metal is deposited.

As should be understood, electrodes 16 and 19 must be electrically conductive to allow the insertion of electrical signals, e.g. they must have a low resistivity. Electrodes 16 and 19 must also have mass loading properties which do not distrub the surface acoustic waves in substrate 11 but the mechanical properties must be sufficient to withstand the stress of operation. Aluminum, which has a conductivity of approximately $0.3 \times 10^6$ Ohms/cm, is used as an electrically conductive element of conductive structure 35. Aluminum also conducts heat well so that heat is distributed throughout transducer 15 and hot spots are eliminated. In this preferred embodiment, the alloy metal is selected from one or more of the elements of the IV and VI columns of the periodic table, such as, for example, titanium, molybdenum, chromium, tungsten, or combinations thereof. The alloy metal is added to conductive structure 35 to strengthen, harden, or toughen electrodes 16 and 19.

The problem is that the addition of the alloy metal increases the resistivity of the conductive structure. Titanium, for example, has a conductivity of $0.02 \times 10^6$ Ohms/cm, or approximately one tenth the conductivity of aluminum. Thus, very high amounts of alloy metal will result in very hard or tough electrodes but with very poor resistivity so that they are virtually unusable. Also, very high amounts of aluminum will result in low resistivity but very soft electrodes which will be quickly destroyed by high frequencies and high power. It has been determined after extensive studies that the alloy metal included in conductive structure 35 should be in a range from approximately 1% to a percent that provides for a reasonable tradeoff of resistivity versus acoustic and mechanical properties in electrode 16 and 19. Less than approximately 1% of the alloy metal results in low resistivity but the mechanical properties, i.e. the toughness, hardness, bonding strength, are too low so that catastrophic failures occur relatively early in the life of the SAW device.

The exact proportion of the alloy metal to the aluminum depends to some extent on the specific alloy metal used, the size of the electrodes, and other characteristics such as the operating frequencies and the power requirements. In a typical example, electrodes 16 and 19 are formed of an alloy of aluminum-titanium with the titanium being in a range of approximately 1% to 25% by weight. Because titanium has a conductivity of approximately one tenth of the conductivity of aluminum, up to 25% can be alloyed with the aluminum without reducing the conductivity to a point at which the electrodes will not conduct sufficiently. The higher percentage of titanium substantially increases the mechanical properties, i.e. the toughness, hardness, bonding strength, so that the chances of catastrophic failures are greatly reduced or eliminated.

As stated above, conductive structure 35 includes aluminum and an alloy metal and each may be deposited in individual layers or simultaneously in a single layer. Further, the various components of device 10 may be defined in several different ways. In one common method, the various materials (e.g. bonding layer 30 and structure 35) are deposited in a blanket and then masked and etched to define structure 10. In a second method, substrate 11 is masked to define device 10 and the various materials are deposited after which a common metal lift-off procedure is performed to result in device 10. Also, various modifications and combinations of these procedures can be used. In any of these procedures the aluminum and the alloy metal can each be deposited in individual layers or simultaneously in a single layer. The conductive structure and the bonding layer or layers are deposited by any of the well known methods, including electron beam (E-beam) evaporation, or thermal evaporation, or sputtering.

Generally, if individual layers of aluminum and the alloy metal are deposited, deposition of a layer of aluminum followed by a layer of alloy metal followed by a layer of aluminum will be performed. The aluminum may mix with the alloy metal as it is deposited to produce a desired aluminum alloy. For thin layers, typically 100 Angstroms or less, the aluminum will generally mix with the metal of bonding layer 30, once bonding layer 30 is deposited and bonded to the surface of substrate 11, the subsequent mixing of aluminum with bonding layer 30 has no effect on the bonding properties. The subsequent deposition of a thin layer of alloy metal also mixes with the aluminum and subsequent thin layer depositions of aluminum mix with the thin alloy metal to form a generally uniform conductive structure 35. An alternative method would utilize starting materials already in an alloy form which are then deposited in a single layer.

Turning now to FIG. 3, a cross-sectional view is illustrated of one SAW electrode, designated 16', of another embodiment of a SAW device 10' similar to SAW device 10 of FIG. 1. The various components of device 10' which are similar to components of device 10 of FIG. 2 are designated with similar numbers having a prime added to indicate the different embodiment. Electrode 16' is fabricated by depositing a bonding layer 30' of bonding material on the surface of a substrate 11'. A conductive structure 35', including at least one layer of conductive material, is deposited in overlying relationship on bonding layer 30'. Conductive structure 35' is formed of material that fixedly bonds to bonding layer 30' and is, therefore, fixedly bonded to the surface of substrate 11'. As described above, conductive structure 35' includes aluminum and an alloy metal, each of which may be deposited in individual layers or simultaneously in a single layer.

In the embodiment illustrated in FIG. 3, a second bonding layer 40' is deposited in overlying relationship on conductive structure 35'. In this specific embodiment, layer 40' serves to bond or hold structure 35' together. Second bonding layer 40' includes any materials which will bond properly with electrodes 16 and 19 and will not unduly load device 10'. Such materials are generally elements in the IV or VI columns of the periodic table, for example, titanium, titanium-tungsten, titaniumtungsten-nitride, chromium, molybdenum, and combinations thereof. It is imperative that, if included, layer 40' bonds rigidly to the surface of conductive structure 35'. Any release or pealing of layer 40' from conductive structure 35' results in failure of device 10'.

Because of the natural mixing at the interface of various metals during deposition, it is desirable to determine the total alloy metal content of the bonding layer (30 or 30')the conductive structure (35 or 35'), and the upper bonding layer (40') if present. Because at least some of the alloy metals from the bonding layers may mix with the conductive structure during deposition, it is generally desirable to take this into account when determining the amount of alloy metal to include in the conductive structure. For example, if bonding layers 30' and 40' of FIG. 3 are titanium, it may be desirable to take the amount of titanium in these layers into account when determining the amount of titanium to include in conductive structure 35'. In this example, it is desirable for the total amount of titanium in device 10' to be above 1% and generally less than approximately 25%, or a percent providing a reasonable trade-off of resistivity versus mechanical properties in the surface acoustic wave electrode.

Thus, a new and improved high power surface acoustic wave device and method of fabrication are disclosed. The new and improved high power surface acoustic wave device greatly reduces catastrophic failures, such as blow-outs or fragmentation during operation. Further, the new and improved high power surface acoustic wave device is specifically engineered to bear the tremendous stress present in SAW devices while accommodating the relatively high power (1 Watt or more) and the very high radio frequency (RF) signals at which the present SAW devices must operate. Catastrophic mechanical failures are believed to be substantially or completely eliminated by the present invention.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A high power surface acoustic wave device comprising:

a piezoelectric substrate having a surface; and a surface acoustic wave electrode positioned on the surface of the substrate, the surface acoustic electrode including;

a bonding layer (consisting of a metal selected from elements in one of the IV and VI columns of the periodic table) deposited on the surface of the substrate and bonding with the surface; and a conductive structure of at least one layer of material overlying the bonding layer and fixedly bonded to the surface by the bonding layer, the conductive structure including aluminum and an alloy metal with the alloy metal being in a range from at least greater than 1% to about 50% by weight.

2. A high power surface acoustic wave device as claimed in claim 1 wherein the alloy metal range is between at least greater than 1% and about 25% by weight.

3. A high power surface acoustic wave device as claimed in claim 1 wherein the bonding layer consisting of metal includes one of titanium, titanium-tungsten, titanium-tungsten-nitride, chromium, and combinations thereof.

4. A high power surface acoustic wave device as claimed in claim 1 wherein the alloy metal includes a metal selected from elements in one of the IV and VI columns of the periodic table.

5. A high power surface acoustic wave device as claimed in claim 4 wherein the alloy metal includes one of titanium, molybdenum, chromium, and tungsten.

6. A high power surface acoustic wave device as claimed in claim 1 wherein the conductive structure includes a plurality of layers of the aluminum and the alloy metal.

7. A high power surface acoustic wave device as claimed in claim 1 wherein the conductive structure includes a single layer of aluminum and the alloy metal.

8. A high power surface acoustic wave device as claimed In claim 1 including in addition a second bonding layer of metal selected from elements in one of the IV and VI columns of the periodic table overlying the conductive structure and bonded thereto.

9. A high power surface acoustic wave device comprising:

a piezoelectric substrate having a surface; and a surface acoustic wave electrode positioned on the surface of the substrate, the surface acoustic wave electrode including;

a bonding layer consisting of one of titanium, titanium-tungsten, titanium-tungsten-nitride, chromium, and combinations thereof deposited on the surface of the substrate and bonding with the surface; and a conductive structure with at least one layer overlying the bonding layer and fixedly bonded to the surface by the bonding layer, the conductive structure including aluminum and an alloy metal including one of titanium, molybdenum, chromium, and tungsten with the alloy metal being in a range from at least greater than 1% to about 25% by weight.

10. A high power surface acoustic wave device as claimed in claim 9 including in addition a second bonding layer of metal selected from elements in one of the IV and VI columns of the periodic table overlying the conductive structure and bonded thereto.

* * * * *